(12) United States Patent
Yu et al.

(10) Patent No.: US 7,957,130 B2
(45) Date of Patent: Jun. 7, 2011

(54) ATTACHED-TYPE MEMORY DEVICE

(75) Inventors: Hong-Chi Yu, Kaohsiung (TW); Tse-Ming Lin, Kaohsiung (TW)

(73) Assignee: Walton Advanced Engineering Inc., Kaohsiung (TW)

( * ) Notice: Subject to any disclaimer, the term of this patent is extended or adjusted under 35 U.S.C. 154(b) by 108 days.

(21) Appl. No.: 12/385,636

(22) Filed: Apr. 15, 2009

(65) Prior Publication Data
US 2010/0238622 A1   Sep. 23, 2010

(30) Foreign Application Priority Data
Mar. 20, 2009   (TW) ................................ 98109222 A

(51) Int. Cl.
*G06F 1/16*   (2006.01)
*H05K 5/00*   (2006.01)
*H05K 7/00*   (2006.01)

(52) U.S. Cl. ............................. 361/679.31; 361/679.03

(58) Field of Classification Search ............. 361/679.03, 361/679.31
See application file for complete search history.

(56) References Cited

U.S. PATENT DOCUMENTS

| | | | |
|---|---|---|---|
| 6,763,410 B2 * | 7/2004 | Yu | 710/74 |
| 6,767,218 B2 * | 7/2004 | Marmaropoulos | 439/37 |
| 6,863,539 B2 * | 3/2005 | Marmaropoulos | 439/37 |
| 6,926,544 B2 * | 8/2005 | Lee | 439/147 |
| 6,970,157 B2 * | 11/2005 | Siddeeq | 345/168 |
| 6,983,888 B2 * | 1/2006 | Weng | 235/492 |
| D545,220 S * | 6/2007 | Leung | D10/31 |
| D556,194 S * | 11/2007 | Rambosek et al. | D14/356 |
| 7,341,464 B2 * | 3/2008 | Cuellar et al. | 439/135 |
| D570,597 S * | 6/2008 | Klein | D3/207 |
| D581,926 S * | 12/2008 | Kim | D14/356 |
| 2004/0083320 A1* | 4/2004 | Yu | 710/62 |
| 2004/0151071 A1* | 8/2004 | Kocher | 368/10 |
| 2004/0233786 A1* | 11/2004 | Ting | 368/2 |
| 2005/0205678 A1* | 9/2005 | Ponert | 235/492 |
| 2005/0237704 A1* | 10/2005 | Ceresoli | 361/683 |
| 2006/0140055 A1* | 6/2006 | Ehrsam et al. | 368/10 |
| 2006/0261958 A1* | 11/2006 | Klein | 340/572.8 |
| 2007/0066088 A1* | 3/2007 | Rambosek et al. | 439/37 |
| 2007/0287923 A1* | 12/2007 | Adkins et al. | 600/485 |
| 2008/0019090 A1* | 1/2008 | Zhu et al. | 361/684 |
| 2008/0280490 A1* | 11/2008 | Nguyen et al. | 439/607 |
| 2009/0143689 A1* | 6/2009 | Berry et al. | 600/508 |

* cited by examiner

*Primary Examiner* — Jayprakash N Gandhi
*Assistant Examiner* — Adrian S Wilson
(74) *Attorney, Agent, or Firm* — Bacon & Thomas, PLLC

(57) ABSTRACT

The present invention relates to an attached-type memory device, which includes a support seat, a connection part. The support seat has an accommodation room for housing a flash memory; the connection part contains at least an elastic sleeve member and at least a fitting member, in which the fitting member is integrated with the support seat, and two sides of the elastic sleeve member are disposed on two side edges of an end face of the fitting member.

7 Claims, 9 Drawing Sheets

ATTACHED-TYPE MEMORY DEVICE

FIELD OF THE INVENTION

The present invention relates to an attached-type memory device, and more particularly to an attached-type memory device having a support seat and a connection part, and providing good portability.

BACKGROUND OF THE INVENTION

Because of the rapid evolution of information technology, digital electronic products have been widely applied to various life curricula of people. Speaking of portable digital storage device, the fast development of semiconductor fabrication process pushes the floppy diskette with larger size on the brink of elimination. Instead, the digital storage device with larger capacity and smaller size becomes the substitute of the floppy diskette, among which especially the storage device with the transmission interfaces of various memory cards, universal serial bus (USB) and external serial ATA (e-SATA) prevail as a result of the advantages of small size and large capacity.

Whereas, while the size of flash memory becomes smaller and smaller, it is easy to get lost upon being deposited and carried along by user.

Therefore, it is necessary to design an attached-type memory device to resolve the aforementioned issue.

SUMMARY OF THE INVENTION

To overcome the foregoing issue, the main objective to the present invention is to provide an attached-type memory device. The design of a support seat and a connection part enables that a flash memory can be housed in an accommodation room; and the design of the connection part integrated with a cylindrical object allows that the present invention is sleeved on other cylindrical object in accordance with user's personal usual practice or preference, so that the flash memory won't be easily lost during a received, deposited or carry-along condition.

To achieve the aforementioned objective, the present invention employs the following skill of an attached-type memory device. The attached-type memory device includes a support seat and a connection part. The connection part contains at least an elastic sleeve member with two ends disposed on two side edges of an end face of the fitting member and at least a fitting member being integrated with the support seat.

Preferably, each of two opposite end faces of the fitting member has a pivotal pin, one end of the support seat corresponding to the accommodation room has two pivotal holes, and the pivotal pin is inserted in the pivotal hole.

Preferably, each of the end face of the fitting member having the pivotal pin intersects with a respective end face of the fitting member being in contact with the elastic sleeve member.

Preferably, the fitting member has an engagement groove, the support seat has a through hole on one side thereof corresponding to the accommodation room, and the engagement groove is engaged in the through hole.

Preferably, the engagement groove is disposed on an end face of the fitting member corresponding to the elastic sleeve member.

Preferably, the fitting member has at least a positioning channel and at least a positioning member, and the positioning member is disposed in the positioning channel penetrating through the fitting member to contact with two end faces of the elastic sleeve member, the positioning member has at least a push rod, and a top end of the push rod penetrates through an outer periphery of the fitting member.

Preferably, the elastic sleeve member is made of a rubber material.

Preferably, the positioning member is made of a rubber material.

The foregoing and other features and advantages of the present invention will be more clearly understood through the following descriptions with reference to the drawing, wherein:

BRIEF DESCRIPTION OF THE DRAWINGS

FIG. 3-1 is a top view before moving the push rod in the first preferred embodiment in accordance with the present invention;

FIG. 3-2 is a top view after moving the push rod in the first preferred embodiment in accordance with the present invention;

FIG. 3-3 is an A-A cross-sectional view of FIG. 3-1 in accordance with the present invention;

FIG. 3-4 is a B-B cross-sectional view of FIG. 3-2 in accordance with the present invention;

FIG. 4 is an exploded view showing the parts of the second preferred embodiment in accordance with the present invention;

FIG. 6-1 is a top view before moving the push rod in the second preferred embodiment in accordance with the present invention;

FIG. 6-2 is a top view after moving the push rod in the second preferred embodiment in accordance with the present invention;

FIG. 6-3 is a C-C cross-sectional view of FIG. 6-1 in accordance with the present invention;

FIG. 6-4 is a D-D cross-sectional view of FIG. 6-2 in accordance with the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for the purpose of illustration and description only; it is not intended to be exhaustive or to be limited to the precise form disclosed.

Figure 1:
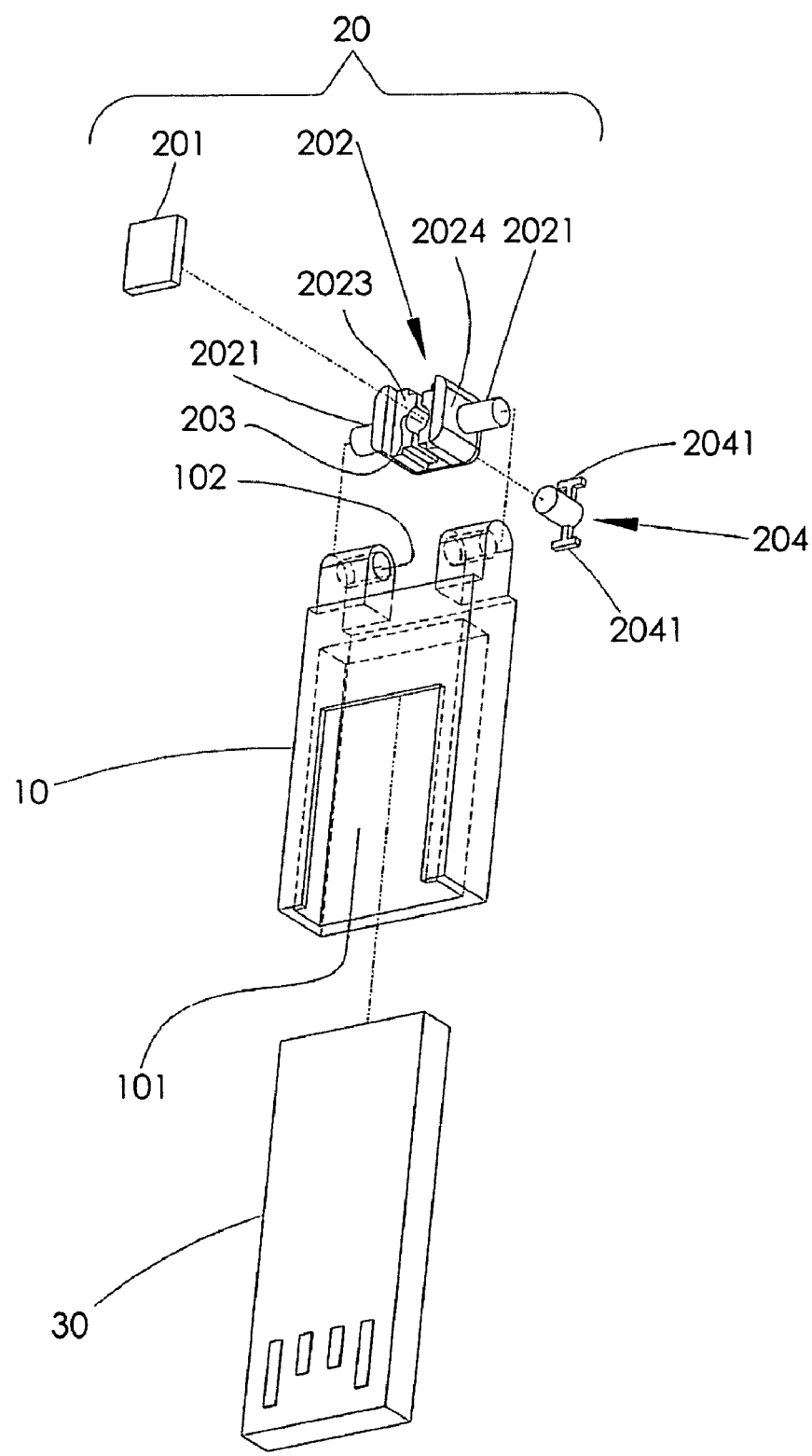
FIG. 1 is an exploded view showing the parts of the first preferred embodiment in accordance with the present invention.

Please refer to FIG. 1, which is an exploded view showing the parts of the first preferred embodiment of the present invention in association with an attached-type memory device. The attached-type memory device includes a support seat 10 and a connection part 20, in which the support seat 10 has an accommodation room 101 for housing a flash memory 30, the connection part 20 contains at least an elastic sleeve member 201 and at least a fitting member 202 for being fitted with the support seat 10, in which each of the two opposite end faces 2024 of the fitting member 202 has a pivotal pin 2021, one end of the support seat 10 corresponding to the accommodation room 101 has two pivotal holes, and the pivotal pin 2021 is inserted in the pivotal hole 102.

Besides, two ends of the elastic sleeve member 201 are mounted to two side edges of the end face 2023 of the fitting member 202. The elastic sleeve member 201 is made of a rubber material. In addition, the end faces 2024 of the fitting member 202 having the pivotal pin 2021 intersect with the end faces 2023 of the fitting member 202 which are in contact with the elastic sleeve member 201.

The fitting member 202 contains at least a positioning channel 203 and at least a positioning member 204. The positioning member 204 is disposed in the positioning channel 203, in which the positioning channel 203 penetrates through the fitting member 202 to contact with the end faces 2023 of the elastic sleeve member 201, the positioning member 204 has at least a push rod 2041, the top end of the push rod 2041 penetrates through the outer periphery of the fitting member 202, and the positioning member 204 is made of a rubber material.

Figure 2:
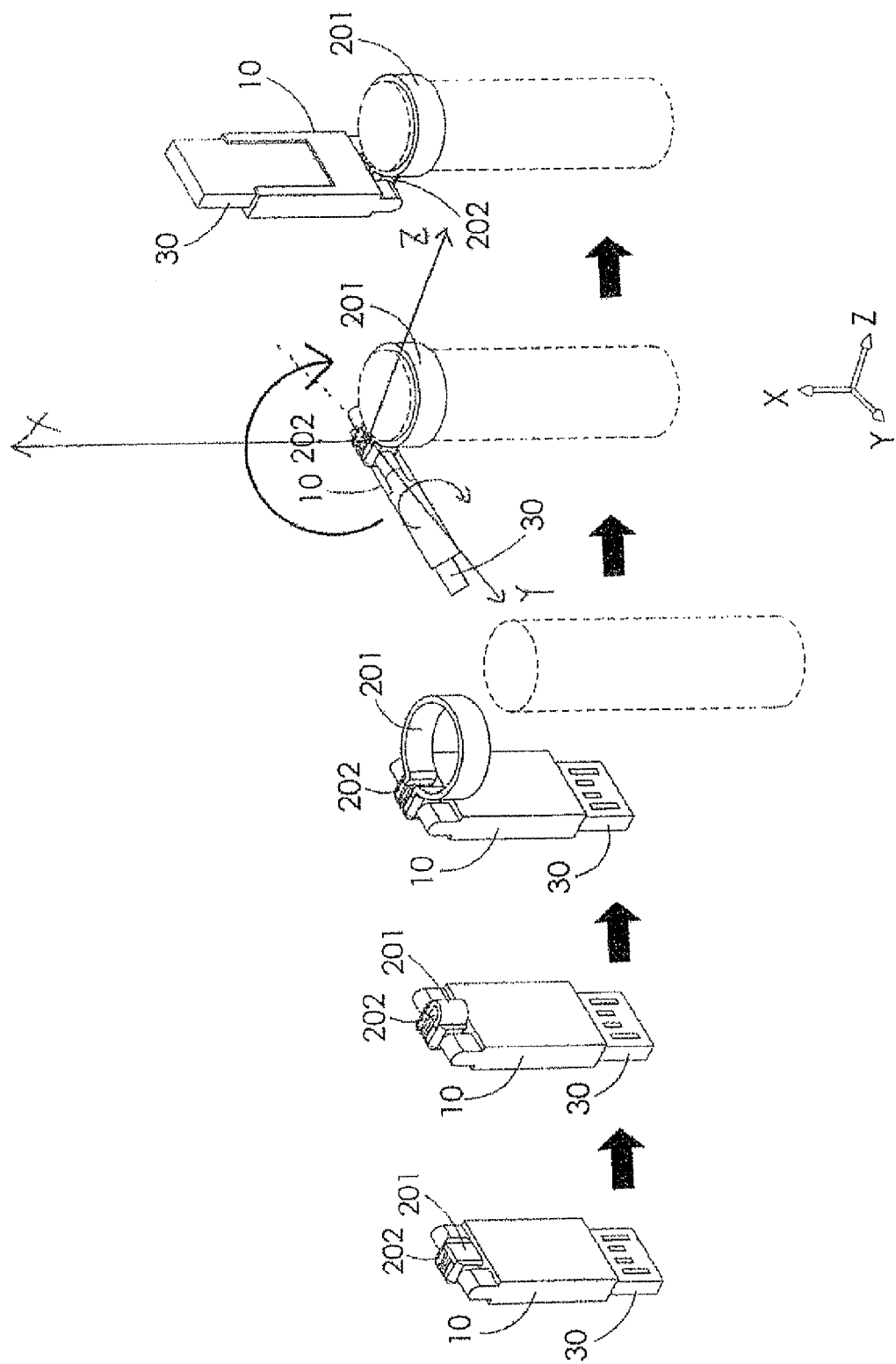
FIG. 2 is a flow diagram showing the first preferred embodiment in accordance with the present invention.

Please refer to FIG. 2, which is a flow diagram showing the first preferred embodiment in accordance with the present invention. The elastic sleeve member 201 is stretched to an appropriate length so that the elastic sleeve member 201 can be sleeved on a cylindrical object, and the fitting member 202 is pivotally integrated with the support seat 10 to make the support seat 10 rotate around the Y axis, thereby enhancing the operational convenience of user upon using the flash memory 30 and also reducing the missing probability of the flash memory 30.

Figures 1, 3:
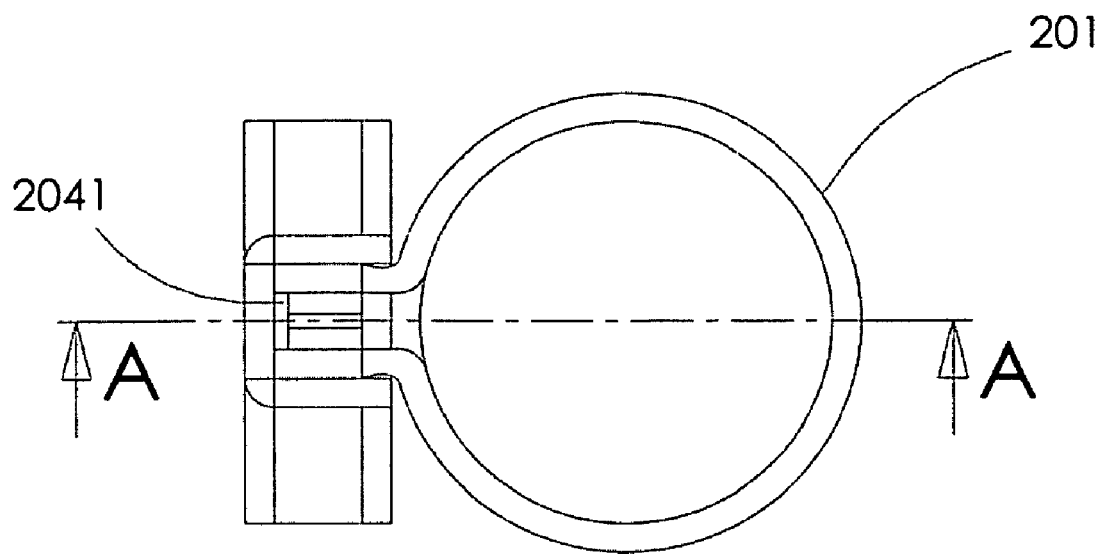
Figures 2, 3:
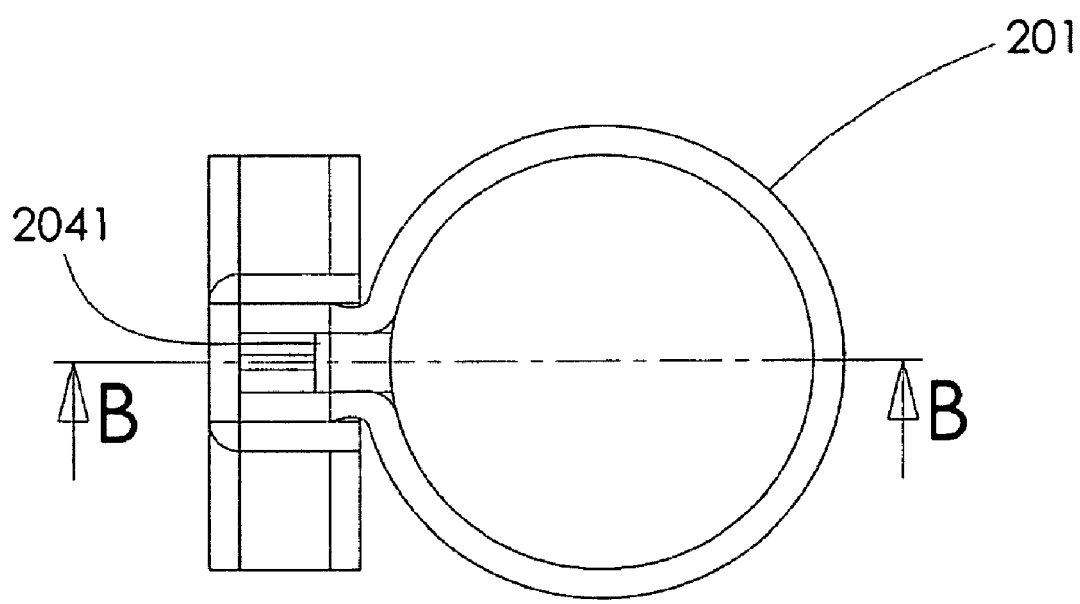
Figure 3:
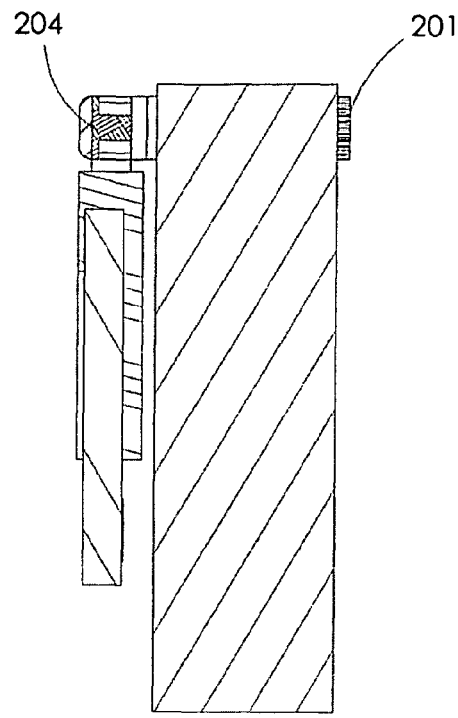
Figures 3, 4:
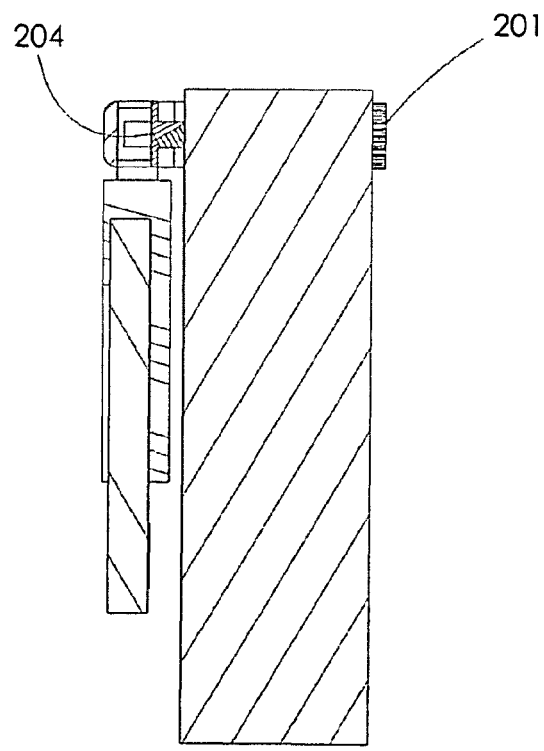
Figure 4:
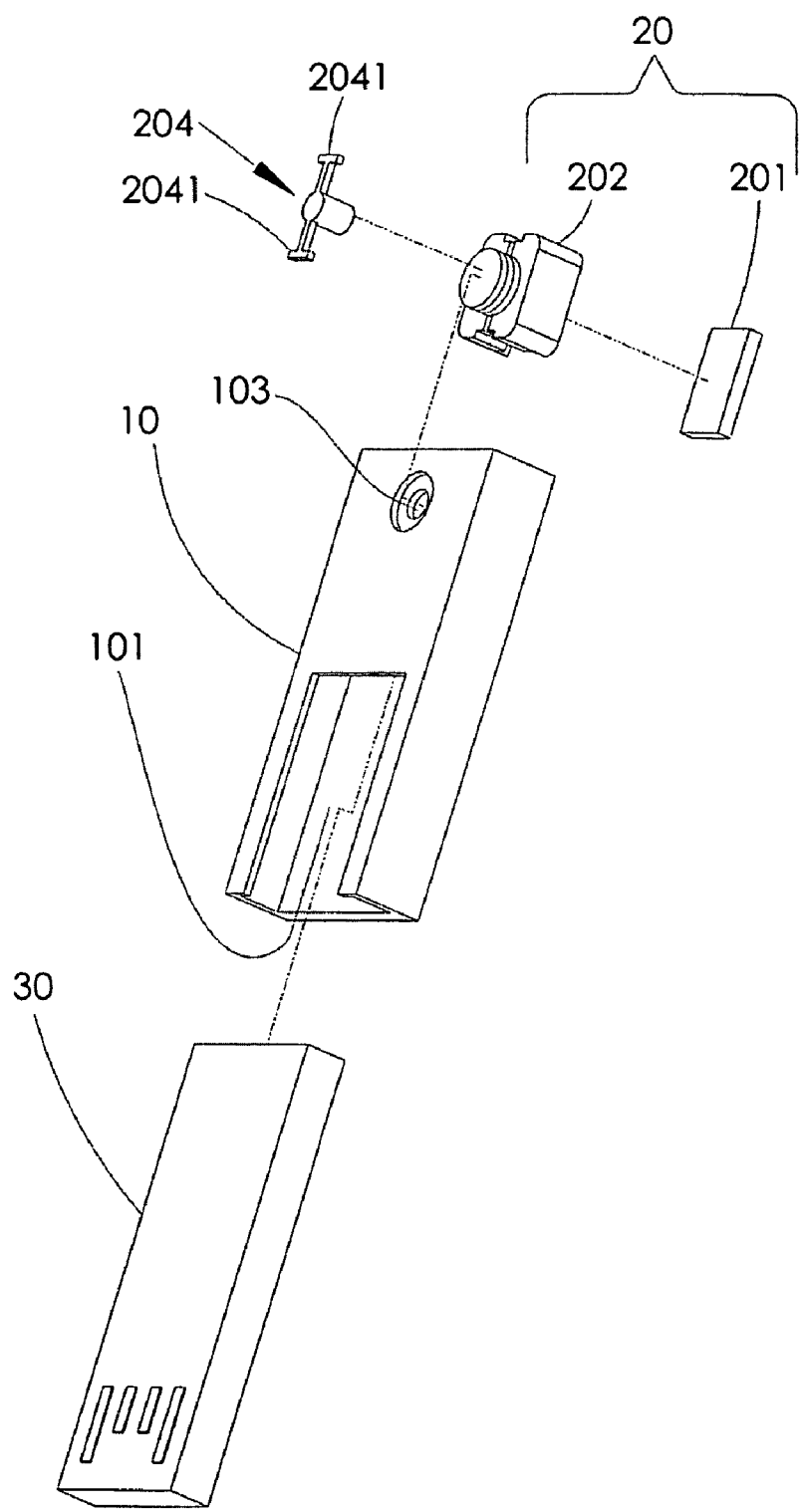

Please further refer to FIG. 3-1 to 3-4. After the elastic sleeve member 201 is sleeved around the cylindrical object, the nature of the rubber material of the elastic sleeve member 201 augments the friction between the elastic sleeve member 201 and the cylindrical object; preferably, the push rod 2041 can also be moved to make the positioning member 204 in touch with the cylindrical object. As a consequence, the friction between the elastic sleeve member 201 and the cylindrical object is increased by virtue of the nature of the rubber material of the elastic sleeve member 201 so that the attached-type memory device of the present invention can be more firmly sleeved around the cylindrical object. The elastic sleeve member 201 can be sleeved around a cylindrical object, e.g. pen, projector, finger and so forth.

Figure 7:
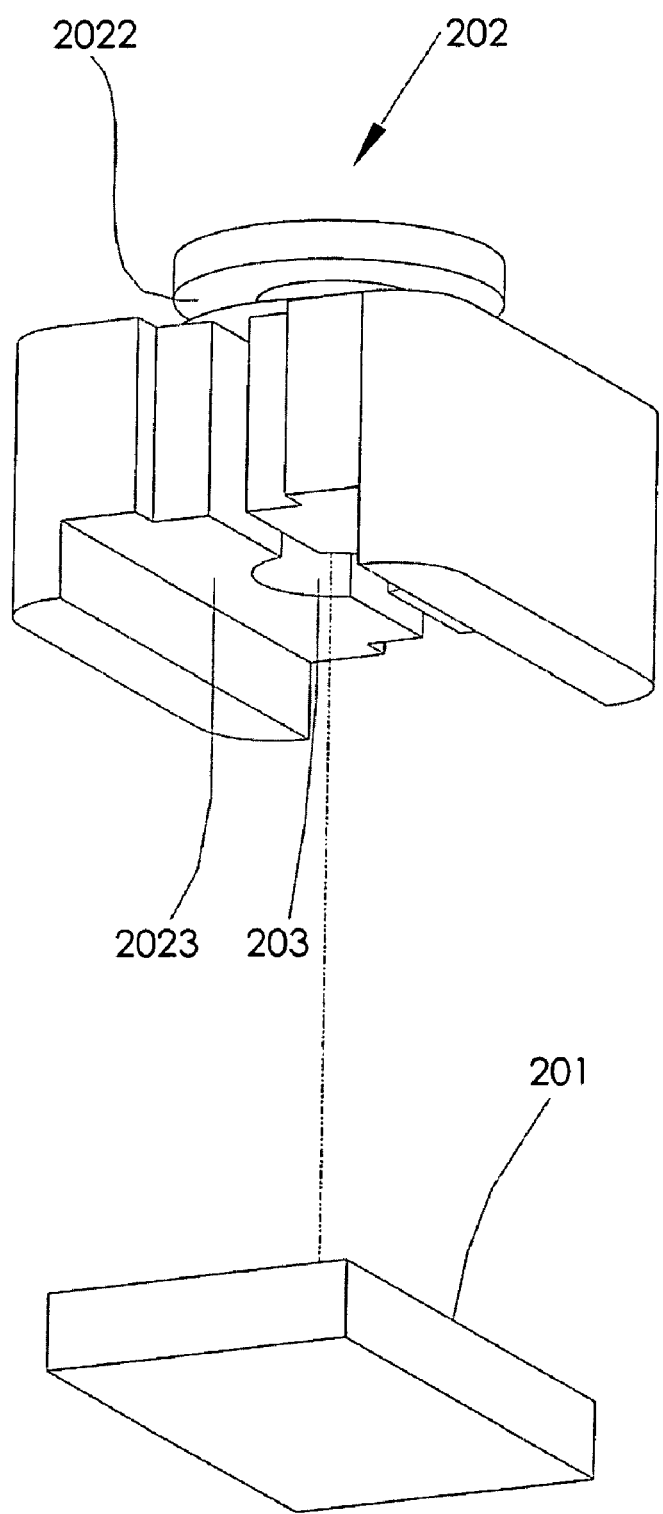
FIG. 7 is an exploded view showing the connection part of the second preferred embodiment in accordance with the present invention.

Please refer to FIG. 4 and FIG. 7, which illustrates an attached-type memory device in association with the second preferred embodiment of the present invention. The attached-type memory device includes a support seat 10 and a connection part 20, in which the support seat has an accommodation space 101 for accommodating a flash memory 30, the connection part 20 contains at least an elastic sleeve member 201 and at least a fitting member 202, the fitting member 202 is integrated with the support seat 10, the fitting member 202 has an engagement groove 2022, the support seat 10 has a through hole 103 on one side thereof corresponding to the accommodation room 101, and the engagement groove 2022 is engaged in the through hole 103.

The two side edges of one end face 2023 of the fitting member 202 are disposed on two ends of the elastic sleeve member 201. The elastic sleeve member 201 is made of a rubber material. Besides, the engagement groove 2022 is disposed on an end face of the fitting member 202 corresponding to the elastic sleeve member 201.

The fitting member 202 contains at least a positioning channel 203 and at least a positioning member 204. The positioning member 204 is disposed in the positioning channel 203, in which the positioning channel 203 penetrates through the fitting member 202 to contact with the end faces 2023 of the elastic sleeve member 201, the positioning member 204 has at least a push rod 2041, the top end of the push rod 2041 penetrates through the outer periphery of the fitting member 202, and the positioning member 204 is made of a rubber material.

Figure 5:
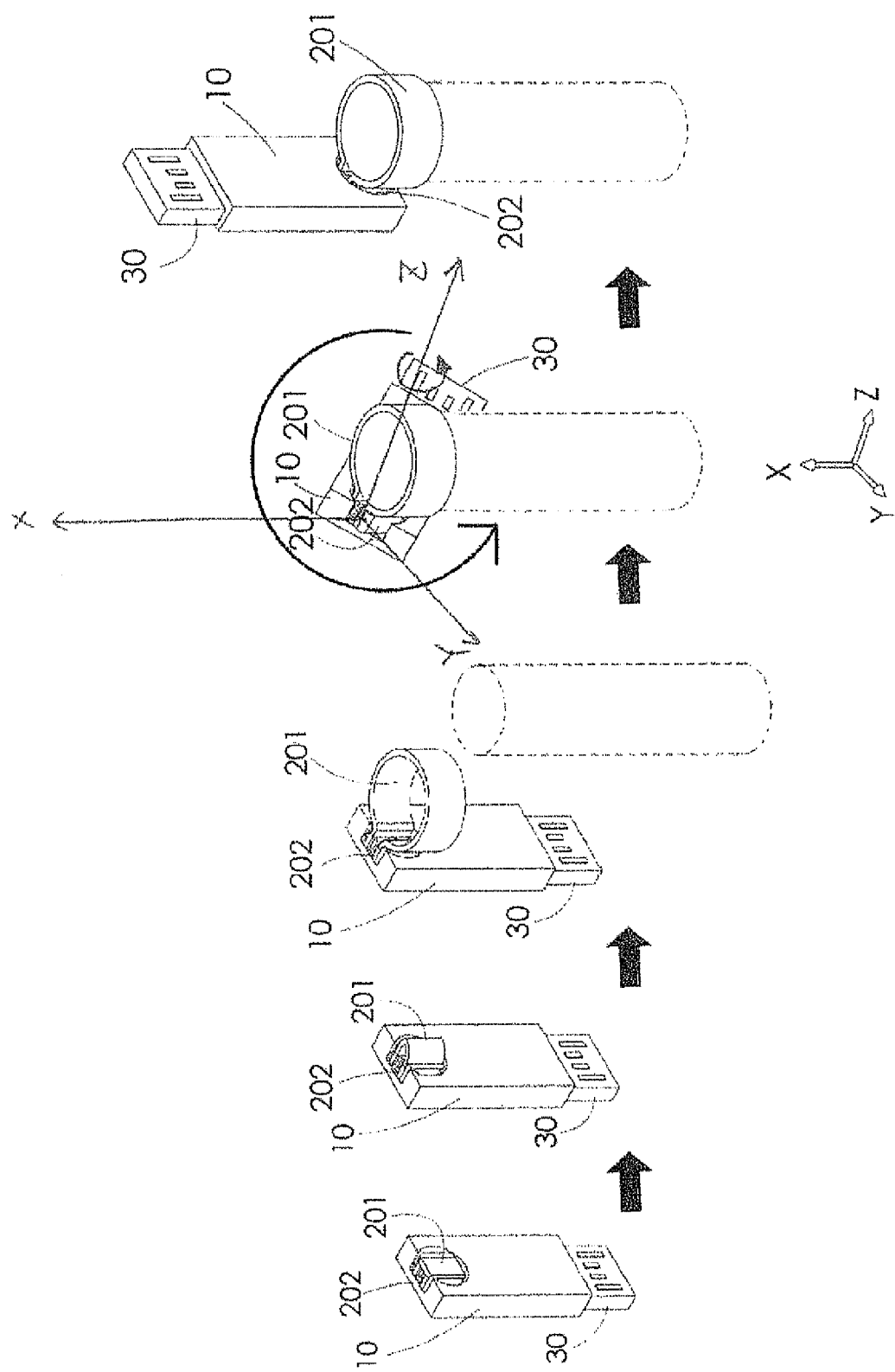
FIG. 5 is a flow diagram showing the second preferred embodiment in accordance with the present invention.

Please further refer to FIG. 5, which is a flow diagram showing the second preferred embodiment in accordance with the present invention. The elastic sleeve member 201 is stretched to an appropriate length so that the elastic sleeve member 201 can be sleeved on a cylindrical object, and the fitting member 202 is pivotally integrated with the support seat 10 to make the support seat 10 rotate around the Z axis, thereby enhancing the operational convenience of user upon using the flash memory 30 and also reducing the missing probability of the flash memory 30.

Figures 1, 6:
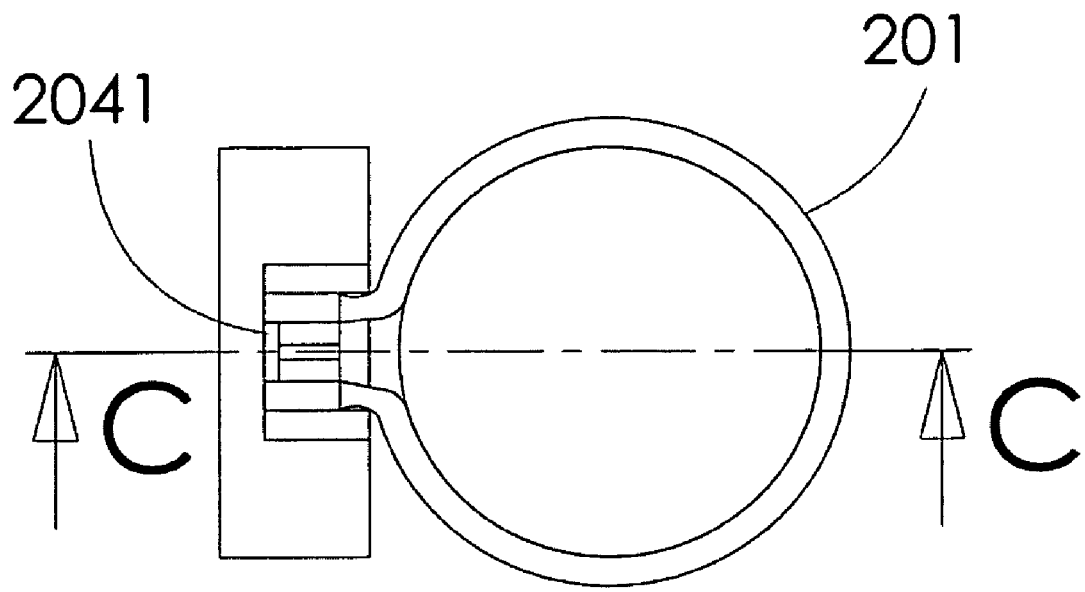
Figures 2, 6:
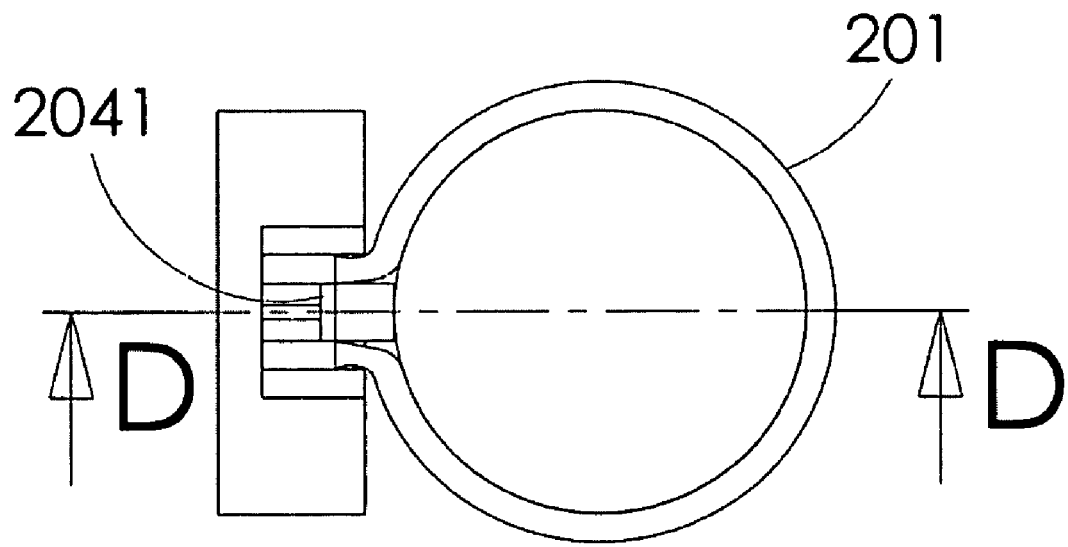
Figures 3, 6:
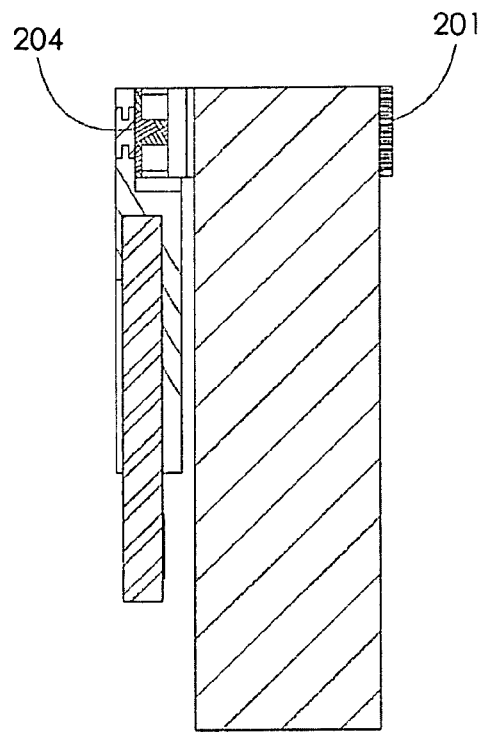
Figures 4, 6:
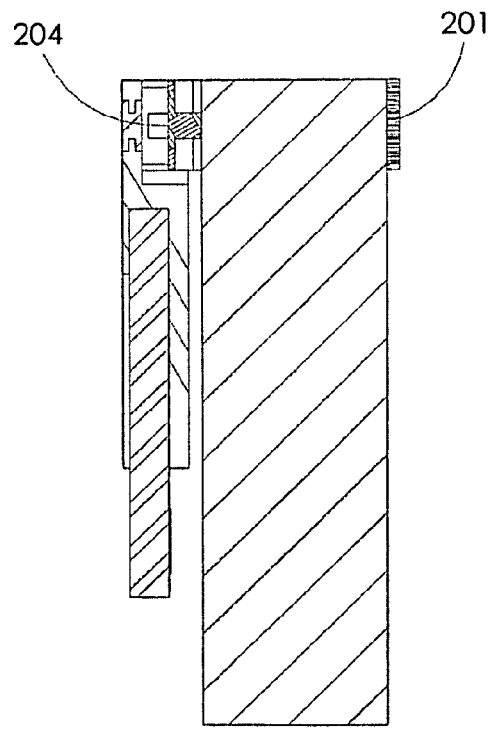

Please further refer to FIG. 6-1 to FIG. 6-4. After the elastic sleeve member 201 is sleeved around the cylindrical object, the nature of the rubber material of the elastic sleeve member 201 augments the friction between the elastic sleeve member 201 and the cylindrical object. Preferably, the push rod 2041 can also be moved to make the positioning member 204 in touch with the cylindrical object. As a consequence, the friction between the elastic sleeve member 201 and the cylindrical object is increased by virtue of the nature of the rubber material of the elastic sleeve member 201 so that the attached-type memory device of the present invention can be more firmly sleeved around the cylindrical object. The elastic sleeve member 201 can be sleeved around a cylindrical object, e.g. pen, projector, finger and so forth.

In sum, the present invention provides an attached-type memory device that allows a flash memory to be housed in the accommodation room of the support seat and prevents the flash memory from being lost easily while being deposited, accommodated and carried along by mounting the elastic sleeve member on a cylindrical object. As such, the present invention provides the practical and innovative value to the industry and the application is hereby submitted in accordance with the patent laws.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An attached-type memory device, comprising:
    a support seat having an accommodation space for housing a flash memory; and
    a connection part having at least a fitting member for being integrated with the support seat, and at least an elastic sleeve member with two ends disposed on two side edges of an end face of the fitting member;
    wherein the fitting member has at least a positioning channel and at least a positioning member, and the positioning member is disposed in the positioning channel, and the positioning member is penetrating through the fitting member to contact with two end faces of the elastic sleeve member, the positioning member has at least a push rod, and a top end of the push rod penetrates through an outer periphery of the fitting member.

2. The attached-type memory device as claimed in claim 1, wherein each of two opposite end faces of the fitting member has a pivotal pin, one end of the support seat corresponding to the accommodation space has two pivotal holes, and the pivotal pin is inserted in the pivotal hole.

3. The attached-type memory device as claimed in claim 2, wherein each of the end face of the fitting member having the pivotal pin intersects with a respective end face of the fitting member being in contact with the elastic sleeve member.

4. The attached-type memory device as claimed in claim 1, wherein the fitting member has an engagement groove, the support seat has a through hole on one side thereof corresponding to the accommodation space, and the engagement groove is engaged in the through hole.

5. The attached-type memory device as claimed in claim 4, wherein the engagement groove is disposed on an end face of the fitting member corresponding to the elastic sleeve member.

6. The attached-type memory device as claimed in claim 1, wherein the elastic sleeve member is made of a rubber material.

7. The attached-type memory device as claimed in claim 1, wherein the positioning member is made of a rubber material.

\* \* \* \* \*